US008389062B2

(12) United States Patent
Wulteputte

(10) Patent No.: US 8,389,062 B2
(45) Date of Patent: Mar. 5, 2013

(54) SPRAYING SYSTEM FOR PROGRESSIVE SPRAYING OF NON-RECTANGULAR OBJECTS

(75) Inventor: Lieven Wulteputte, Melle (BE)

(73) Assignee: Spraying Systems Co., Wheaton, IL (US)

( * ) Notice: Subject to any disclaimer, the term of this patent is extended or adjusted under 35 U.S.C. 154(b) by 2067 days.

(21) Appl. No.: 11/127,960

(22) Filed: May 12, 2005

(65) Prior Publication Data

US 2006/0257581 A1 Nov. 16, 2006

(51) Int. Cl.
*C23C 16/52* (2006.01)

(52) U.S. Cl. .................. 427/421.1; 427/424; 427/427.3; 427/427.7; 118/668; 118/669; 118/684; 118/696; 118/323; 118/300; 118/313

(58) Field of Classification Search ............... 427/421.1, 427/424, 427.3, 427.7; 118/668, 669, 684, 118/696, 300, 313, 323
See application file for complete search history.

(56) References Cited

U.S. PATENT DOCUMENTS 3,356,061 A 12/1967 Wiggins
4,241,656 A 12/1980 Smith
4,419,384 A * 12/1983 Kane et al. ........................ 427/8
4,614,300 A 9/1986 Falcoff
4,744,518 A 5/1988 Toth
4,754,923 A 7/1988 Matsusita et al.
5,067,436 A 11/1991 Matsushima et al.
5,316,219 A 5/1994 Christyson et al.
5,645,884 A * 7/1997 Harlow et al. .................... 427/8
6,267,301 B1 7/2001 Haruch

FOREIGN PATENT DOCUMENTS

EP 0 579 417 A 1/1994

* cited by examiner

*Primary Examiner* — Timothy Meeks
*Assistant Examiner* — Nathan T Leong
(74) *Attorney, Agent, or Firm* — Leydig, Voit & Mayer, Ltd.

(57) ABSTRACT

A system and method for spray gun or nozzle control wherein the spray gun liquid discharge pattern is dynamically varied to correspond to the dimensions of a moving target object or a portion of the moving target. The spray gun includes inputs for fan air, atomizing air, and liquid, as well as cylinder air. Upon detection of a target object approaching, such as on a conveyor belt, the fan air pressure, atomizing air pressure, liquid pressure, and cylinder air pressure are varied according to predefined or contemporaneously generated curves to provide a spray pattern that corresponds to the shape of the target object or portion of the target object, thus minimizing waste and inefficiency due to overspray.

11 Claims, 6 Drawing Sheets

LIQUID SUPPLY
CYL. AIR
ATOMIZING AIR
FAN AIR

PRESSURIZED LIQUID SUPPLY
ATOMIZING AIR
FAN AIR
CYLINDER AIR
FAN
ATOM.

SPRAYING SYSTEM FOR PROGRESSIVE SPRAYING OF NON-RECTANGULAR OBJECTS

FIELD OF THE INVENTION

The present invention relates generally to spraying systems and, more particularly, to a method and apparatus for spraying of non-rectangular objects while the objects and/or a spraying apparatus are translated in a single direction relative to each other.

BACKGROUND OF THE INVENTION

Spraying systems utilizing spray guns or like spray nozzle assemblies have a wide variety of applications in industrial settings today. Spray guns are very often used to disperse a liquid material, such as to cover an area or object with particles of the sprayed material. One particular usage of such spraying systems is in the preparation of packaged or other food products. For example, a cereal product may be conveyed on a transfer belt past an array of spray guns which coat the cereal product with sweetener, additives, supplements, or the like. Such a system is often more practical than using a more targeted application system, such as manual or automated brushings or other coating devices, to coat individual units of the food product.

However, by its very nature, spraying is directionally less discriminate than more targeted methods, and so the economies generated by avoiding manual labor for the coating process can be offset or minimized by wastage of the sprayed material. This is due to the fact that a substantial amount of the sprayed material may end up on a conveyor belt, support, or other manufacturing element instead of on the product that is intended to be coated. In addition, this overspray typically must be removed from the manufacturing environment by manual labor, incurring additional costs. Moreover, such cleaning often entails halting the production line temporarily while cleaning is performed, causing a loss of productivity.

Hence, a spraying system is needed whereby overspray is minimized, thus maximizing the economies afforded by this type of material delivery technology.

OBJECTS AND SUMMARY OF THE INVENTION

It is an object of the present invention to provide a spraying system for spraying non-rectangular or other irregular shaped objects while minimizing overspray.

Another object is to provide a manufacturing system wherein a spray gun a nozzle system is employed to maximize the economy provided by spray coating, while minimizing material wastage.

Yet another object of the invention is to provide a method and a computer-readable medium embodying the method for dynamically varying the spray pattern of a spray gun or nozzle such that the pattern is concentrated on the selectively moving non-rectangular object without substantial overspray.

Other objects and advantages of the invention will become apparent upon reading the following detailed description and upon reference to the drawings, in which:

Figure 1:
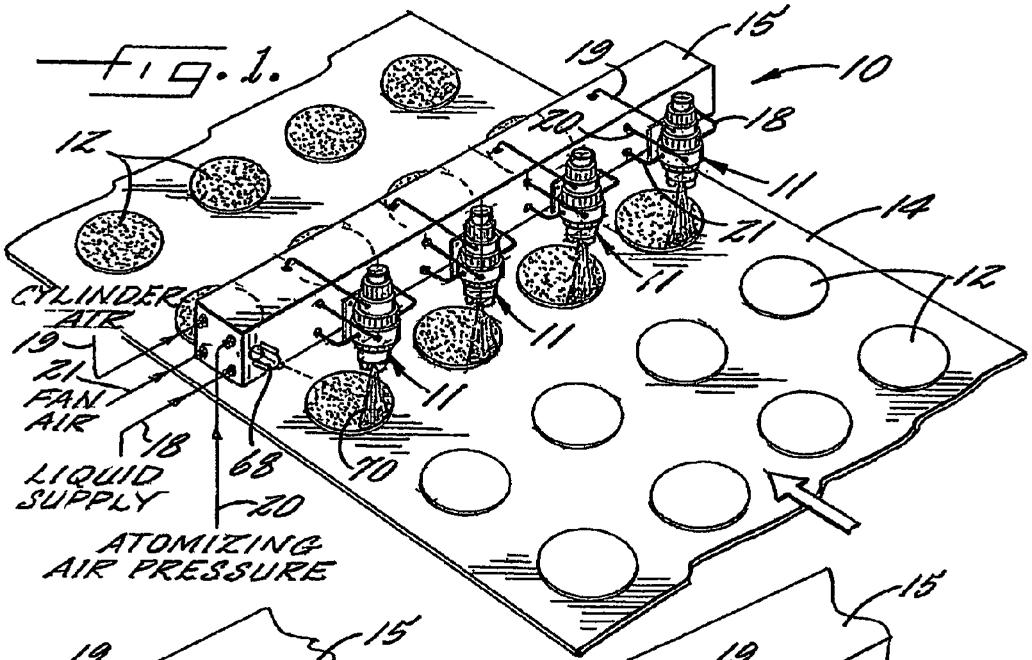
FIG. 1 is a perspective of a spraying system in accordance with the invention for spraying non-rectangular objects on a moving conveyor belt.

While the invention is susceptible of various modifications and alternative constructions, a certain illustrated embodiment thereof has been shown in the drawings and will be described below in detail. It should be understood, however, that there is no intention to limit the invention to the specific form disclosed, but on the contrary, the intention is to cover all modifications, alternative constructions and equivalents falling within the spirit and scope of the invention.

DETAILED DESCRIPTION OF THE INVENTION

Referring now more particularly to the drawings, there is shown an illustrative spraying systems 10 in accordance with the invention, which in this case comprises a plurality of laterally spaced spray guns 11 for directing a coating onto non-rectangular products 12 such as round pizzas, arranged in laterally spaced rows on a conveyor belt 14, as the conveyor belt 14 passes the round products 12 beneath the spray guns 11. The spray guns 11 in this case each are supported on a common header 15 oriented for directing discharging sprays downwardly onto the passing products 12. As depicted in FIG. 1, and as will become apparent, fluid supply lines 18-21 for the spray guns 11 are connected to and communicate with manifold passages formed longitudinally in the header 15, which in turn communicate the respective fluid supplies. It will be understood that the number of spray guns 11 may vary depending upon particular spray applications.

Figures 3, 4:
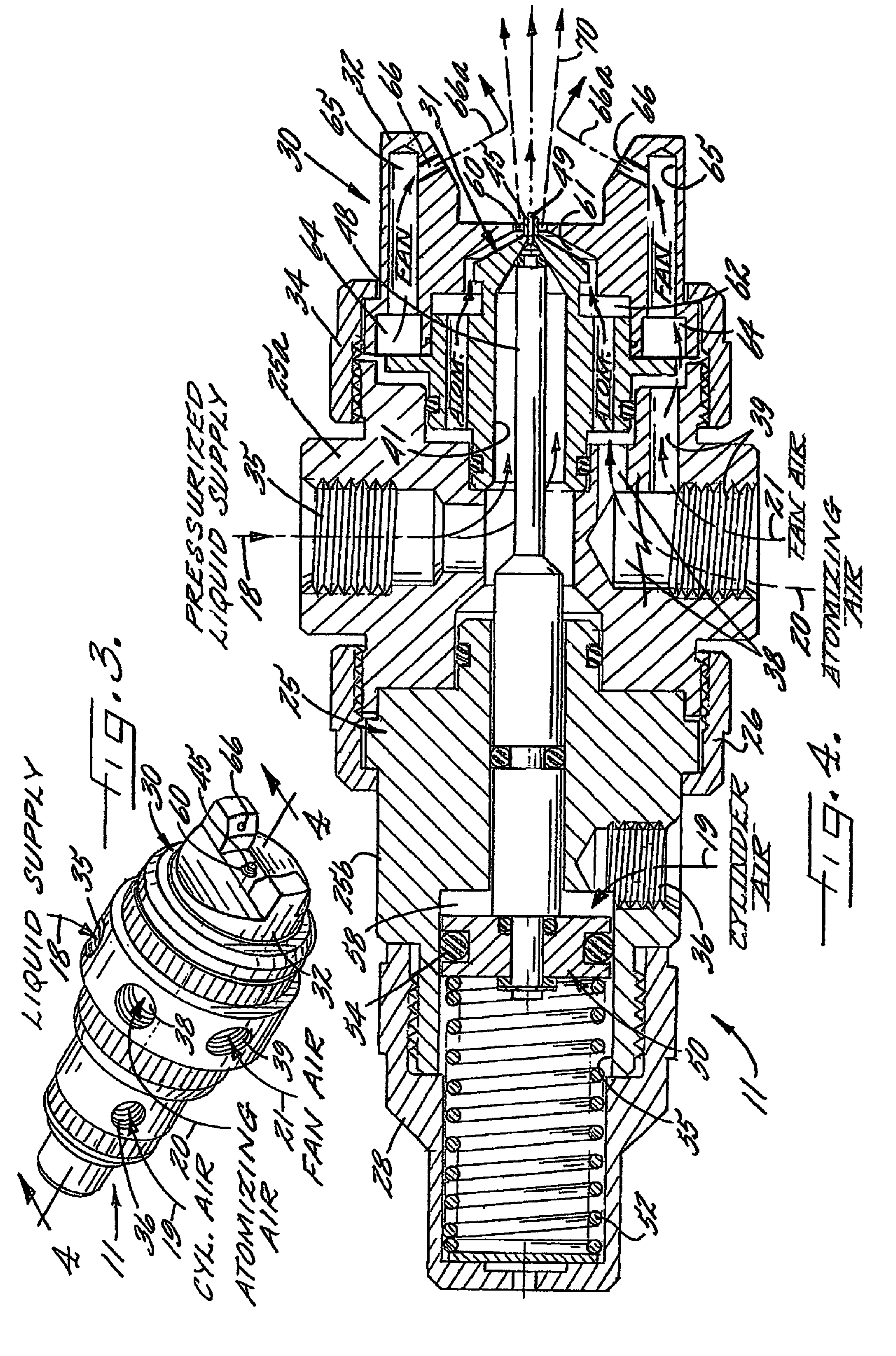
FIG. 3 is an enlarged perspective of one of the spray guns of the illustrated spraying system.
FIG. 4 is an enlarged longitudinal section of the illustrated spray gun, taken in the plane of line 4-4 in FIG. 3.
Figure 5:
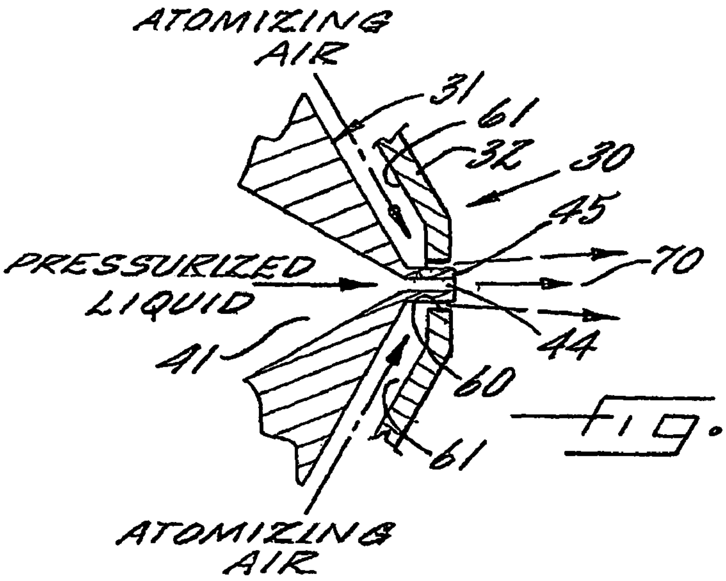
FIG. 5 is an enlarged fragmentary section of the spray nozzle assembly of the spray guns.
Figure 6:
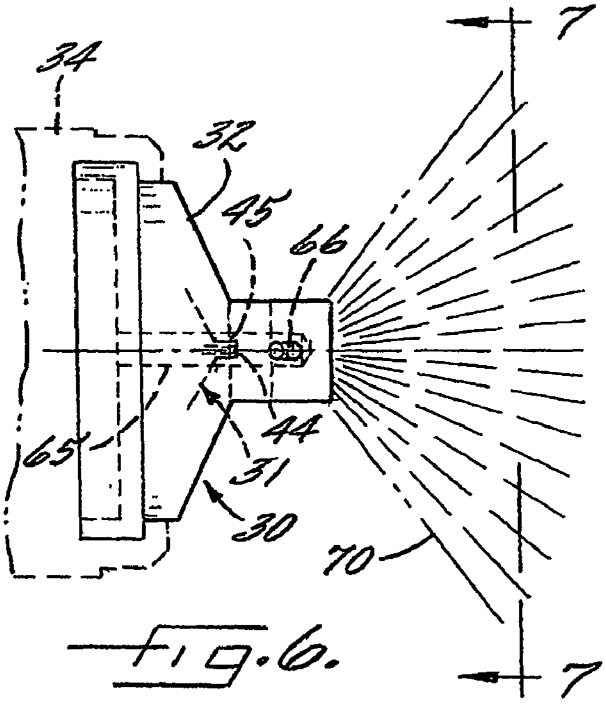
FIG. 6 is a side elevation of one of the illustrated spray guns and its discharging spray pattern.
Figure 7:
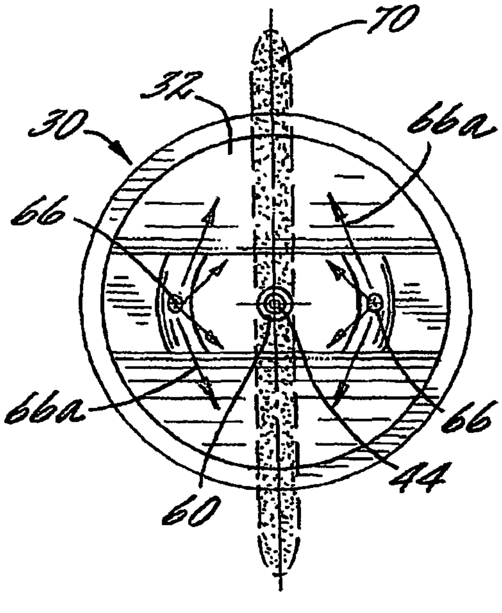
FIG. 7 is a front elevation of the illustrated spray gun taken in the plane of line 7-7 in FIG. 6.

The spray guns 11 may be of a known type, such as an external mix, air atomizing spray nozzle assembly shown in U.S. Pat. No. 6,776,360 assigned to the same assignee as the present invention, the disclosure of which is incorporated herein by reference. The illustrated spray guns 11, as best depicted in FIG. 4, each include a main body or housing 25, in this case comprising forward and rearward housing sections 25*a*, 25*b* coupled together by a threaded retaining ring 26, a rear housing cap 28 threadably engageable with the rear body section 25*b*, and a nozzle assembly 30 at a downstream end of the nozzle body 25 which includes a spray tip or nozzle insert 31 and an air cap 32 mounted in overlying surrounding relation to the spray tip 31 and retained on the nozzle body by a retaining nut 34. The illustrated nozzle body 25 has a liquid inlet port 35, a cylinder air inlet port 36, an atomizing air inlet port 38, and a fan air inlet port 39. Liquid is supplied to the inlet port 35 from the respective liquid supply line 18 (FIG. 1) and communicates with a central longitudinal passageway 41 in the spray tip 31 and through a liquid discharge orifice 44 defined by a forwardly extending nose portion 45 of the spray tip 31 (FIG. 5).

For controlling the discharge of liquid from the spray gun 11, a valve needle 48 coaxially extends through the housing body 25 for reciprocating movement between a valve closing position in seated engagement with a downstream tapered entry section of the spray tip passage 41 and an unseated valve open position. The valve needle 48 in this case has a tapered seating section and an axially extending clean out nose portion 49 that is positionable into and through the discharge orifice 44 when in a closed position (FIG. 4) for maintaining the passage free of buildup during usage.

For operating the valve needle 48, a piston 50 is mounted at an upstream end of the needle 48 which is biased in a valve closing direction by a compression spring 52 interposed between the piston 50 and the upstream housing cap 28. The piston 50 carries an annular sealing ring 54 in sealing engagement with a cylindrical bore 55 in the housing body 25. The compression spring 52 biases the piston 50, and hence the valve needle 48, forwardly to a fully seated, i.e., valve close position, depicted in FIG. 4. The valve needle 48 is moveable axially in the opposite direction (to the left in FIG. 4) against the force of the spring 52 by pressurized air (hereinafter "cylinder air") selectively directed into the cylinder air inlet port 36 from the pressurized air supply line 19 (FIG. 1), which communicates through the housing body 25 with an air chamber 58 on the downstream side of the piston 50.

For atomizing the liquid discharging from the spray tip 31, the spray tip nose portion 45 and a central orifice of the air cap 32 define an annular atomizing air discharge orifice 60 which communicate with angled atomizing air passages 61 and an annular air passage 62 defined between the spray tip 31 and air cap 32, which in turn communicates through nozzle body 25 with the atomizing air inlet port 38 connected to the header by the atomizing air supply line 20. Pressurized air directed through the annular discharge orifice 60 communicates outwardly of the liquid discharge orifice 44 for interaction with the discharging liquid flow stream.

For forming and directing the discharging liquid spray into a flat fan spray pattern for wider lateral application onto the moving products 12, each spray gun 11 is operable for impinging pressurized air (i.e., "fan air") on opposite sides of the liquid spray. In the illustrated embodiment, pressurized air is communicated to the fan air inlet port 39 of the spray gun 11 from the pressurized air supply line, which in turn communicates through the nozzle body 25 with an annular chamber 64 adjacent an upstream end of the air cap 32. The annular chamber 64 communicates pressurized air to a pair of longitudinal passages 65, which terminate in opposed angled discharge passages 66 that direct pressurized air streams **66*a*** at an acute angle on opposite sides of the discharging liquid spray for spreading the liquid spray into a relatively flat narrow spray pattern transverse to the direction of movement of the product upon which it is directed.

Figure 2A:
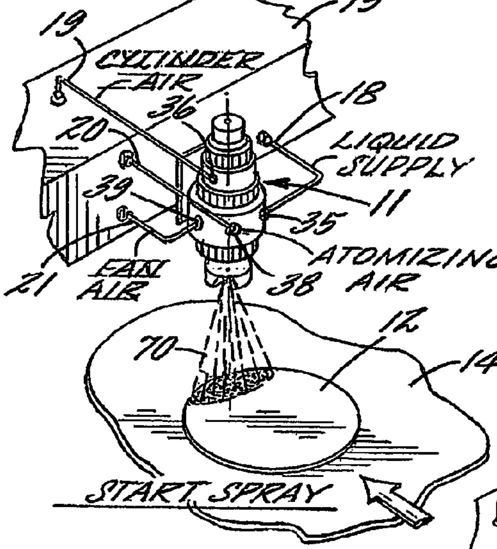
FIG. 2A is an enlarged perspective of one of the spray guns of the illustrated spraying system, wherein a target object is partly under the spray gun and moving toward the spray gun.
Figure 2B:
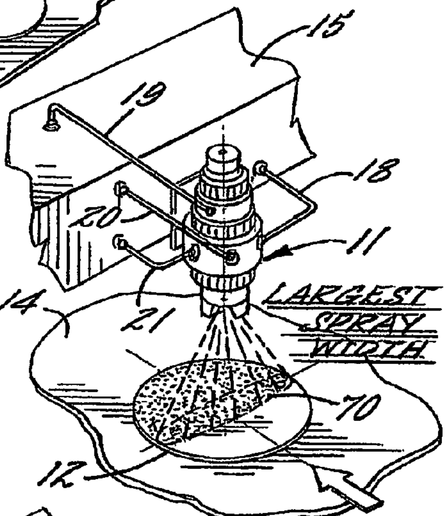
FIG. 2B is an enlarged perspective, similar to FIG. 2A, wherein the target object is midway under the spray gun.
Figure 2C:
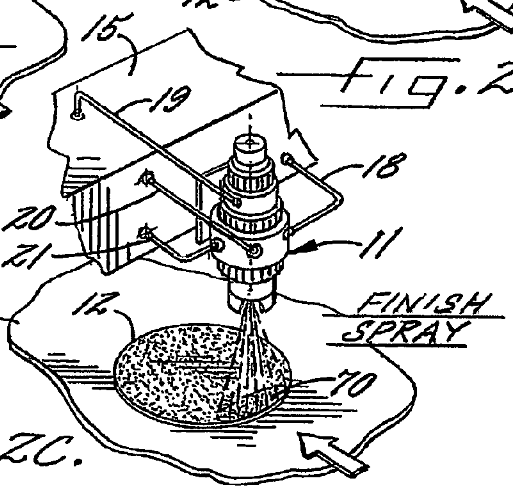
FIG. 2C is a perspective, similar to FIGS. 2A and 2B, wherein the target object is partly under the spray gun and moving away from the spray gun.

In accordance with an important aspect of the invention, a control system is provided for dynamically varying the dispersal pattern yielded by the spray guns according to the shape of the non-rectangular products being conveyed past the spray guns. More particularly, the pattern variation is tied to the shape and rate of translation of the non-rectangular products to be sprayed. In this manner, the spray pattern is concentrated on the target object, minimizing the waste and mess associated with conventional spraying of non-rectangular objects. In the illustrated embodiment, the manner in which the spray gun discharge spray pattern is dynamically altered to reduce wastage and mess, while assuring product coverage, is depicted in FIGS. 2A-2C. As the conveyor belt 14 carries the product 12 to a position in which it begins to pass directly beneath a spray gun 11, the spray gun is activated, such as by detection of the target product 12 by a sensor 68 disposed adjacent the conveyor belt. The sensor output is connected to a control station or a computer for controlling the spraying operation, as will become apparent. Upon activation of the spray gun operation, a spray pattern 70 is emitted from the spray gun that is only wide enough to cover the narrow width of the product 12 at that point. As the product 12 passes beneath the spray gun 11, the spray pattern 70 is progressively altered to assure coverage of the product 12 without substantially over spraying and coating the conveyor belt 14.

Thus, as the widest point of the product 12 passes beneath the spray gun 11, as depicted in FIG. 2B, the width of the spray pattern 70 has increased to substantially correspond to the maximum width of the product 12 at that point. Moreover, as will become apparent, the total spray flow is increased in proportion to the spray width so that the coverage density of wider areas is similar to that of narrower areas. With the product 12 having passed almost completely under the spray gun 11, as depicted in FIG. 3C, the spray pattern 70 has progressively narrowed to a width corresponding to the width of the product 12 at that point under the spray gun. It will be appreciated that by dynamically altering the spray pattern of the spray gun 11 in this manner to correspond to the product 12 being coated the spraying is effective for both minimizing waste and inefficiency caused by over spray, while enabling proper spray coverage of the product.

Figure 8:
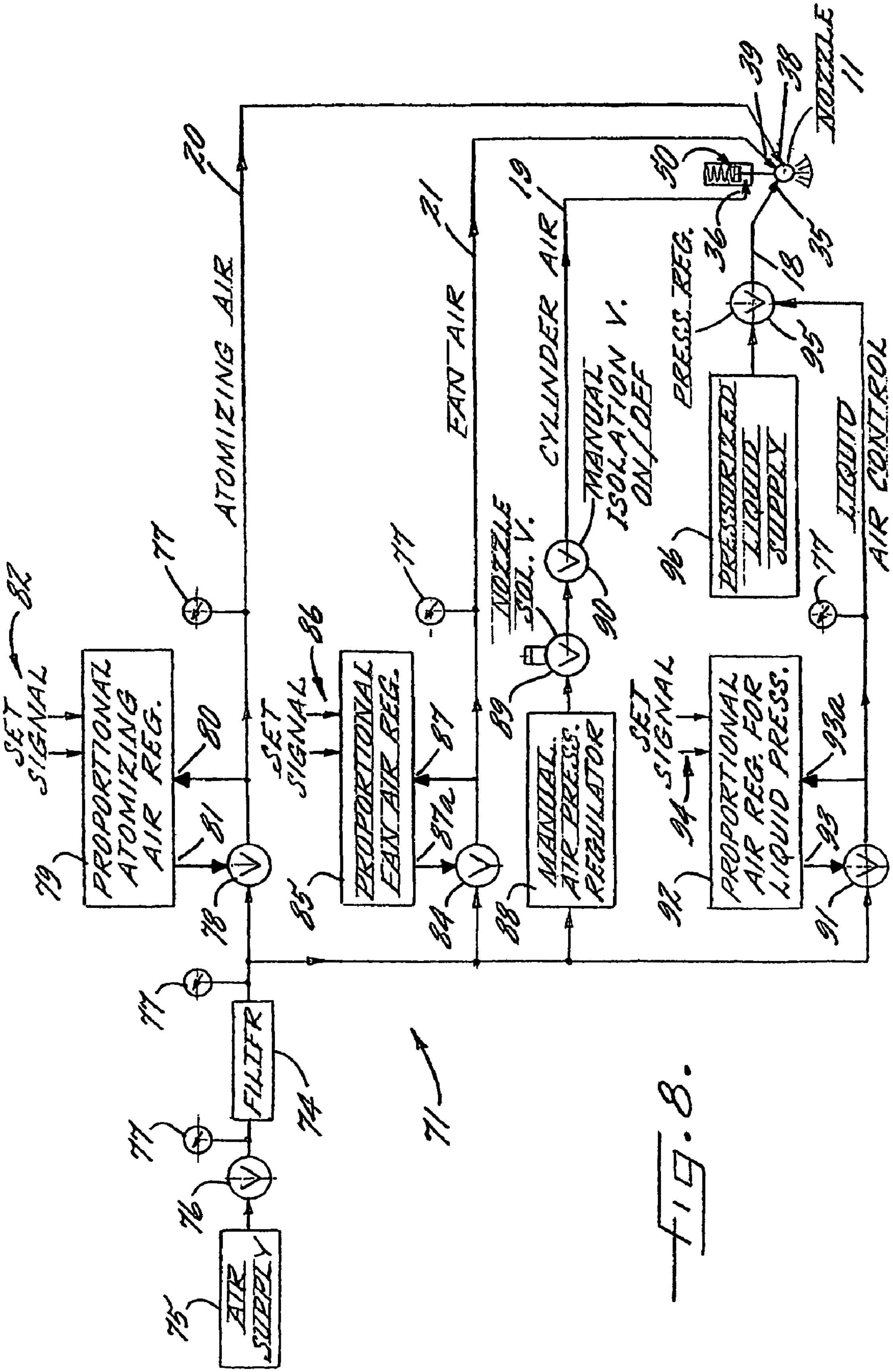
FIG. 8 is a system diagram of the illustrated spraying system showing the air supply, liquid supply, and controllers in relation to the illustrated spray guns.

In carrying out the invention, the control system includes a fluid supply control 71 for controlling the supply of liquid, cylinder air, atomizing air, and fan air to the spray guns. The illustrated fluid control, as depicted in FIG. 8, is connected to a pressurized air supply 75 via an air supply isolation valve 76, pressure indicator (or gauge) 77, and an air filter 74. From the air supply isolation valve 76, pressurized air from the air supply 75 enters the system, such as via pressure tubing, to provide atomizing air pressure, fan air pressure, cylinder air pressure (to turn the spray gun needle valve on and off), and air for releasing pressurized liquid to the spray guns. In particular, the air from the air supply isolation valve 76 is communicated to a valve 78 controlled by a proportional atomizing air regulator 79 having three primary inputs and outputs. The proportional atomizing air regulator 79 detects the pressure in the line pressure via inlet 80 and controls the line pressure in accordance with a set signal input 82. From the valve 78, pressurized air is supplied to the spray gun atomizing inlet port 38, in this instance via a header manifold passage and the inlet line 20.

The pressurized air from the air supply 75 in this instance also provides fan air to the spray gun 11. In particular, the air supply from valve 76 is supplied to a valve 84 controlled by a proportional fan air regulator 85. The proportional fan air regulator 85 controls the valve 84 via output **87*a* in accordance with a set signal received at input 86, based on the air pressure detected at input 87. Pressurized air from the valve 84 is communicated to the spray gun fan air inlet port 39 via a header manifold passage and the inlet line 21**.

The air from the air supply 75 further provides air supply for opening and closing the valve needle 48 of spray gun 11.

In particular, the air from the valve 76 is fed to a manual air pressure regulator 88 used to preset the air pressure for the spray gun cylinder air (e.g., when the cylinder air is on) which is communicated to a solenoid controlled shut-off valve 89 which can be operated for selectively turning the cylinder air on and off. From the shut-off valve 89, pressurized air can be communicated through a manual isolation valve 90 to the cylinder air inlet port 36 of the spray gun 11 via a manifold passage and the cylinder air inlet line 19.

Finally, the air from the air supply 75 also provides an air supply for controlling the supply of pressurized liquid to the spray gun 11. In particular, the air from air supply 75 is fed to a valve 91 regulated by proportional air regulator for liquid pressure 92. The proportional air regulator for liquid pressure 92 detects the air pressure after valve 91 via inlet 93*a* and controls the valve 91 via outlet 93 in keeping with a set signal received via inlet 94. The air that passes through valve 91 in turn controls a pressure regulating valve 95. The pressure regulating valve 95 controls the flow pressurized liquid from a pressurized liquid supply though the liquid inlet port 35 of the spray gun via a header manifold liquid flow passage and a liquid supply line 18.

Figure 9:
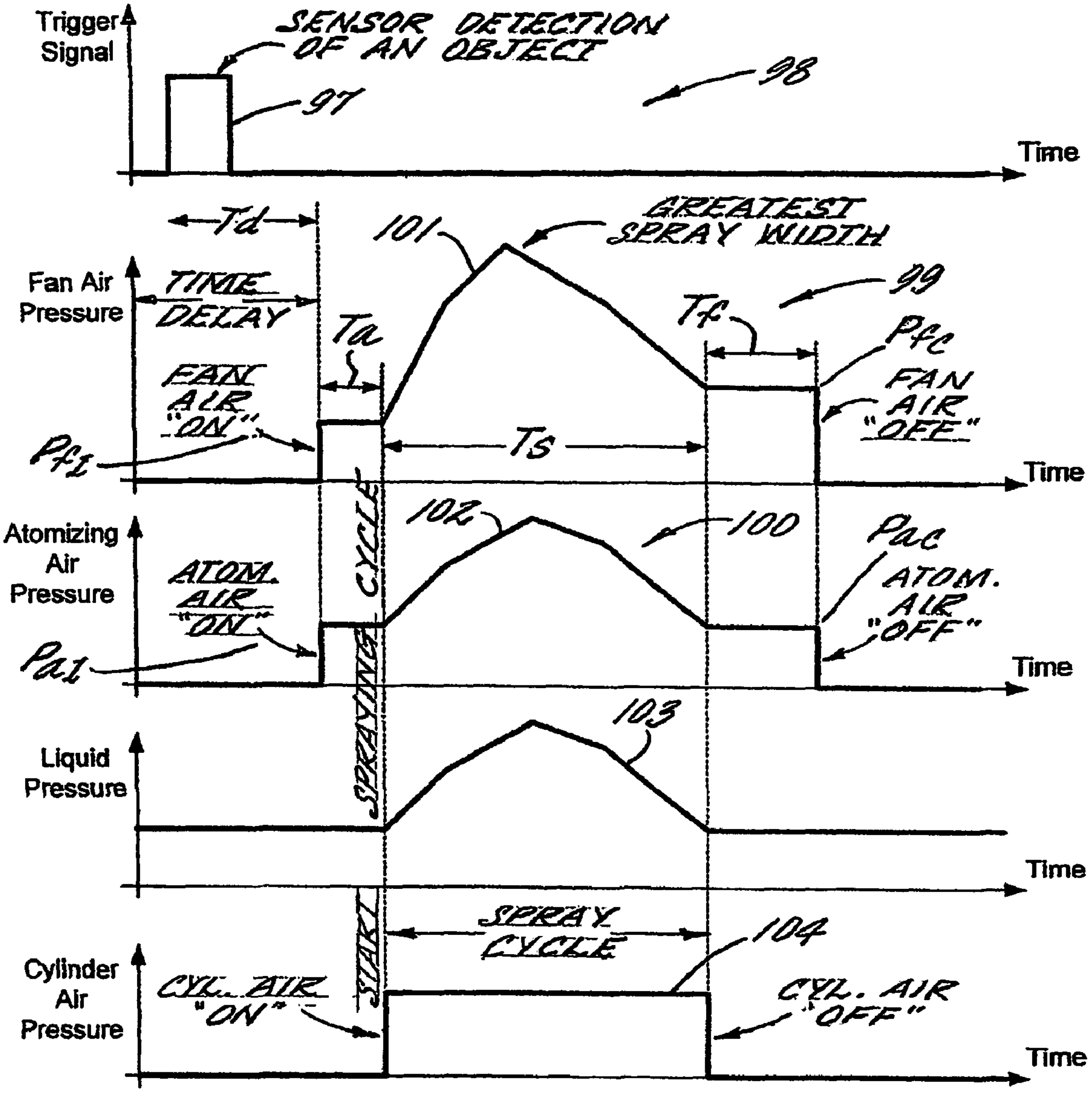
FIG. 9 is a set of correlated timing diagrams showing wave forms for trigger signal, fan air pressure, atomizing air pressure, liquid pressure, and cylinder air pressure to the spray guns during operation of the spraying system.
Figure 10:
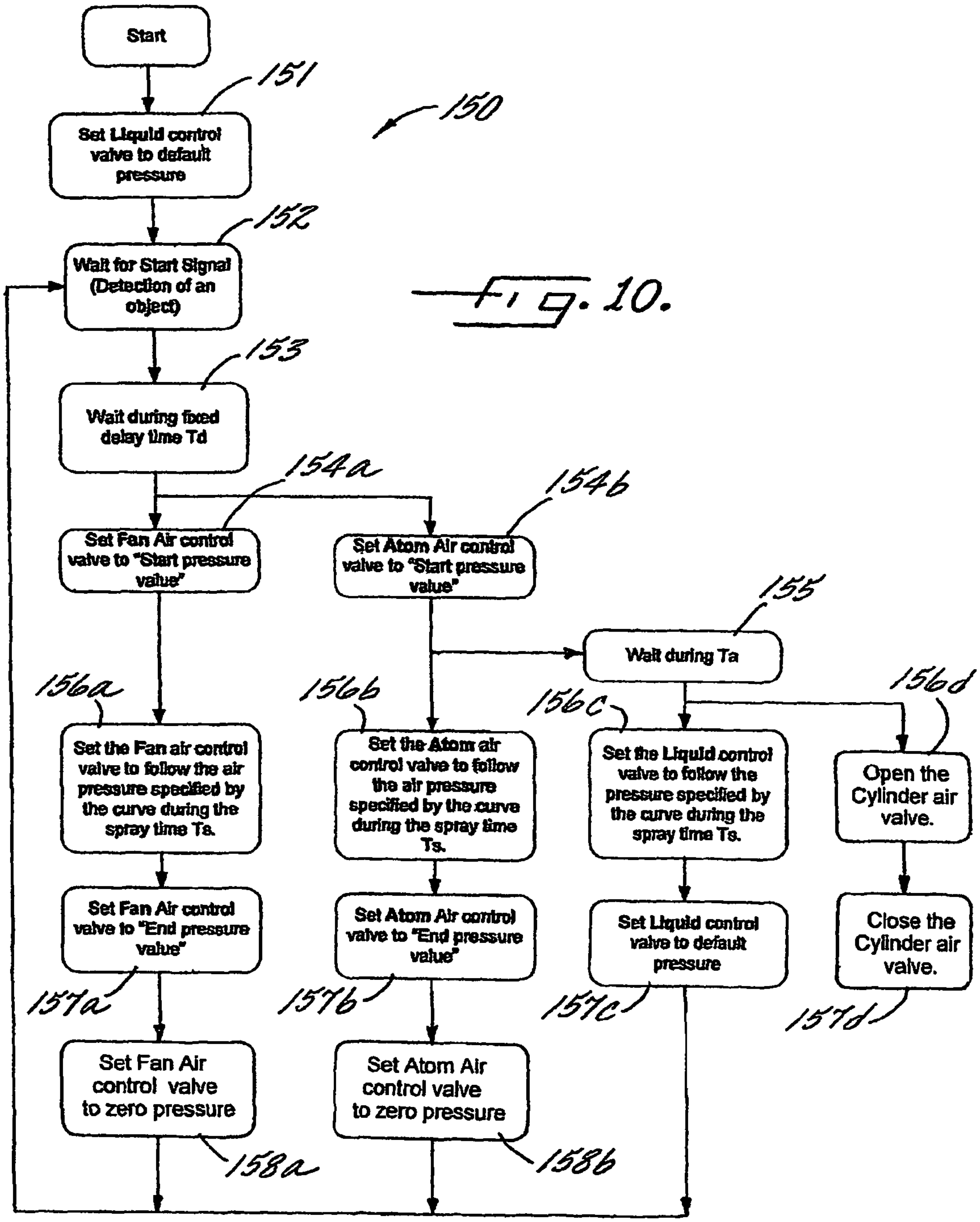
FIG. 10 is a flow chart showing a process of dynamically varying a spray gun spray pattern to correspond to the shape of a target object during operation of the spraying system.

In keeping with the invention, a computer readable medium is provided for varying the spray pattern of the spray guns pursuant to the particular shape of the products to be sprayed. An illustrative process for dynamically controlling the spray pattern of the spray guns is depicted in the timing diagrams shown in FIG. 9 and the flow chart shown in FIG. 10. As depicted in step 151 of flow chart 150, the liquid control valve 95 is set to establish a default pressure for liquid to be supplied to the spray gun 11. At step 152, the process awaits a start signal, i.e., for the target object to be detected. The start signal is shown in FIG. 9 as the trigger signal 97, a square pulse, of timing diagram 98. Once the start signal is received, the process flows to step 153, whereas a delay time $T_d$ is counted off from the leading edge of the trigger signal 97. After waiting for an amount of time $T_d$, the process moves to parallel steps 154*a* and 154*b*. At step 154*a*, the fan air control valve 84 is set to a default start value $P_{fl}$, as shown in timing diagram 99. At the same time, the atomizing air control valve 78 is set to a default start value $P_{a1}$ at step 154*b*, as shown in timing diagram 100.

After expiration of another delay period $T_a$ at step 155, the process flows to parallel steps 156*a*-15*d*. At step 156*a*, the fan air control valve 84 is controlled to supply fan air according to a predefined pressure curve 101 over a period $T_s$. For an approximately circular target object, the curve 101 is approximately semicircular as shown. The greater the fan air pressure, the wider the spray pattern of the spray gun. At the same time, in step 156*b*, the atomizing air control valve 78 is controlled to supply atomizing air according to a predefined pressure curve 102 over the same period $T_s$. At parallel step 156*c*, the liquid control valve 95 is controlled to supply liquid according to a predefined pressure curve 103 over the same period $T_s$. Finally, at the same time at parallel step 156*d*, the cylinder air valve 89 is opened for the same period $T_s$ so that the valve needle of the spray gun is opened during that period. The result of the steps executed to this point is a spray pattern, the extent of which is defined largely by curve 101, the density of which is defined largely by curve 103, and the uniformity of which is defined largely by the relationship of curve 102 to curves 101 and 103. For example, if the liquid pressure curve 103 were flat rather than being similar to curve 101, then the liquid material would be sprayed at a substantially constant rate over a dynamically varied area, resulting in non-uniform density.

After the spray time $T_s$, the process flows to parallel steps 157*a-d*. At step 157*a*, the fan air control valve 84 is controlled to supply fan air at an end pressure value $P_{fe}$ over a period $T_f$. At the same time, at step 157*b*, the atomizing air control valve 78 is controlled to supply atomizing air at an end pressure $P_{ae}$ over the same period $T_f$. In parallel at step 157*c*, the liquid control valve 95 is controlled to supply liquid again at the default pressure. Finally, at step 156*d*, the cylinder air valve 89 is closed so that the valve needle of the spray gun is again closed. At the time, $T_f$ expires, the process flows to parallel steps 158*a-b*. At step 158*a*, the fan air control valve 84 is closed, while at step 158*b*, the atomizing air control valve 78 is closed. After parallel steps 158*a-b*, the process returns to step 152 to await a trigger signal from the arrival of the next target object.

As noted above, the process for dynamically varying a spray gun pattern to correspond to the shape of a moving object may rely on a trigger signal that indicates that a target object is approaching beneath the spray gun. In the illustrated embodiment, this detection function is executed via an electro-optical sensor such as a beam break sensor or difference sensor (to detect difference between target object and conveyor belt). However, the detection function may also be executed via any traditional sensor technology such as trip levers and the like.

Alternatively, the objects to be sprayed are placed at a set of predetermined locations on the conveyor belt. In this instance, the trigger signal may be derived from the interaction of the belt itself with the sensor (e.g., via a break beam sensor mounted adjacent a series of holes on the conveyor belt), or can be internally generated based on the knowledge of the speed of the conveyor belt and the relative positions of objects thereon.

As discussed above, in the illustrated embodiment of the invention, a number of predetermined pressure curves are used to determine the dynamic variance in the spray gun pattern. Alternatively, the shape of the target object may be dynamically detected and the fluid pressures (e.g., fan pressure, atomizing pressure, and liquid pressure) may be determined dynamically based on the detected shape. Although electro-optical sensors preferably may be utilized other sensor types may be used instead depending upon the manufacturing environment. This is especially useful when objects of varied or non-uniform shape are to be spray coated.

It will be appreciated that the process of dynamically varying the spray gun spray pattern described above preferably is automated since the number of variables and the speed and precision with which these variables must be adjusted do not lend themselves to manual operation. Accordingly, the illustrated process described in FIG. 10 preferably is executed by a computer running appropriate software. The computer may be of any configuration, including a personal computer (PC). It will be appreciated that the process software is embodied as a series of computer-executable instructions written on a computer-readable medium such as a magnetic, electronic or optical memory. Alternatively, the process described herein may be embodied instead in a logic circuit having appropriate inputs and outputs, although such a configuration is less flexible and generally less desirable.

It further will be understood that although the invention has been described as allowing a target object to be substantially covered by a sprayed liquid material as it traverses a spray region of a spray gun, the same dynamic variation of the spray pattern is applicable to coating a predetermined portion of the target object comprising less than substantially all of the object surface. For example, the system of the invention could be used to substantially coat a pizza dough with sauce (e.g., leaving only a thin uncoated crust), or to coat half of a cookie with frosting, simply by applying the correct pressure curves to the spray gun inlets as described above. Thus, the extent or density of coverage of the target object is not critical, and can be controlled as desired by the invention described herein to meet user preferences. It will be appreciated that supplying fan air and atomizing air separately via distinct inlets allows greater independence of control over the atomization and fan pattern of the resultant spray. Furthermore, while the illustrated system uses external mix air atomizing spray guns, other forms, including internal mix air atomizing spray guns could be used. Depending upon the pressures being applied, e.g., whether the fan air and atomizing air are varied in the same way, a single orifice spray nozzle alternatively may be used. For purposes herein the term spray gun is intended to generically cover spray nozzle assemblies whether gun-shaped or otherwise.

Finally, although typically the spray guns are stationery, alternatively one or more spray guns may be scanned in a plane parallel to the conveyor belt regardless of whether the conveyor belt is moving. Moreover, although in the illustrated system employs a one-to-one relationship between spray guns and products to be sprayed, it will be appreciated that the invention is not limited to the illustrated systems, and it is contemplated that a single gun may be used to treat a plurality of product units and that multiple guns may be used to treat a single product unit as the shape of the object and other considerations may dictate.

From the foregoing, it can be seen that a spraying system of the present invention is broadly adapted to spray non-rectangular or other irregular shaped items while minimizing material waste and clean-up. The spraying system utilizes a computer readable medium and methodology which dynamically varies the spray pattern from the spray gun or nozzle such that the pattern is concentrated on the selectively moving non-rectangular items without substantial overspray.

The invention claimed is:

1. A method of spraying a target object with a liquid substance from a spray gun assembly having one or more fan air orifices for controlling the width of a spray pattern perpendicular to the target object path, the spray pattern being limited in the direction of the object path to a spray region, the method comprising: transporting the target object along the target object path toward the spray region; detecting when at least a portion of the target object enters the spray region; when at least a portion of the target object enters the spray region, activating the spray gun to eject a spray of the liquid substance; performing a controlled spray operation including: as the target object passes through the spray region, dynamically controlling the width of the spray pattern to conform substantially to a width of the portion of the target object within the spray region; and continuing to transport the target object along the target object path, such that the sprayed liquid material falls substantially on the target object; and when no portion of the target object remains in the spray region, deactivating the spray gun to cease ejection of the spray of the liquid substance.

2. The method of claim 1, wherein controlling the width of the spray pattern to conform substantially to a width of the target object within the spray region includes applying fan air to the one or more fan air orifices at a pressure conforming to a predetermined pressure curve relating target object position to air pressure.

3. The method of claim 2, wherein performing a controlled spray operation includes applying fan air to the one or more fan air orifices at an initial pressure before any portion of the target object is in the spray region.

4. The method according to claim 1, wherein the spray gun assembly further comprises one or more fan air inlets for supplying air to the fan air orifices, one or more liquid inlets for supplying the liquid substance to be sprayed, and one or more atomizing air inlets for supplying air to atomize the sprayed liquid substance, and wherein controlling the width of the spray pattern to conform substantially to the width of the target object within the spray region further includes controlling the respective pressures at which fan air, atomizing air, and the liquid substance are supplied to the spray gun assembly via the one or more fan air inlets, liquid inlets, and atomizing air inlets.

5. The method of claim 1, wherein controlling the width of the spray pattern to conform substantially to a width of the target object within the spray region includes: detecting the width of the target object within the spray region; and dynamically applying fan air to the one or more fan air orifices at a pressure to conform the width of the spray pattern to the width of the target object within the spray region.

6. The method of claim 1, wherein the spray gun assembly further includes a cylinder air inlet for supplying air to control a valve needle within the spray gun assembly to allow or prevent the ejection of the liquid substance from the spray gun assembly, and wherein activating the spray gun to eject a spray of the liquid substance includes supplying air to the cylinder air inlet at sufficient pressure to cause the valve needle to allow the ejection of the liquid substance from the spray gun assembly.

7. The method of claim 6, wherein deactivating the spray gun to cease ejection of the spray of the liquid substance include supplying air to the cylinder air inlet at a pressure sufficiently low to cause the valve needle to prevent the ejection of the liquid substance from the spray gun assembly.

8. The method of claim 1, wherein performing a controlled spraying operation further includes controlling a position of the spray gun assembly in a plane parallel to the direction of motion of the target object.

9. The method of claim 1, wherein detecting when at least a portion of the target object enters the spray region includes detecting the position of the target object via an electro-optical sensor.

10. A method of spraying a non-rectangular object with liquid material from a spray gun comprising: conveying the object in a first direction along a target path toward a spray region; providing a spray gun disposed to project a spray pattern at the spray region, the spray gun being controllable to variably fan the spray pattern in a second direction perpendicular to the first direction; dynamically fanning the spray pattern to spray the liquid material from the spray gun onto the conveyed non-rectangular object in a pattern that is dynamically varied as a function of time to conform substantially to dimensions of a portion of the object that lies within the spray region at any point in time, in a plane parallel to both the first direction and the second direction.

11. The method of claim 10, wherein the spray gun comprises a fan air input, an atomizing air input, and a liquid material input, and wherein dynamically fanning the spray pattern includes dynamically varying the pressures at which fan air, atomizing air, and liquid material are supplied to the fan air input, atomizing air input, and liquid material input respectively.

* * * * *